United States Patent
Iida et al.

[11] Patent Number: 6,120,598
[45] Date of Patent: Sep. 19, 2000

[54] METHOD FOR PRODUCING A SILICON SINGLE CRYSTAL HAVING FEW CRYSTAL DEFECTS, AND A SILICON SINGLE CRYSTAL AND SILICON WAFERS PRODUCED BY THE METHOD

[75] Inventors: Makoto Iida; Eiichi Iino; Masanori Kimura; Shozo Muraoka, all of Gunma-ken, Japan

[73] Assignee: Shin-Etsu Handotai Co., Ltd., Tokyo, Japan

[21] Appl. No.: 09/459,849

[22] Filed: Dec. 13, 1999

Related U.S. Application Data

[62] Division of application No. 09/173,931, Oct. 16, 1998, Pat. No. 6,027,562.

[30] Foreign Application Priority Data

Oct. 17, 1997 [JP] Japan .................................. 9-303483

[51] Int. Cl.[7] .................................................. C30B 15/08
[52] U.S. Cl. ................................................ 117/13; 117/20
[58] Field of Search .................................. 117/13, 20

[56] References Cited

U.S. PATENT DOCUMENTS

| | | |
|---|---|---|
| 4,981,549 | 1/1991 | Yamashita et al. . |
| 5,264,189 | 11/1993 | Yamashita et al. . |
| 5,611,857 | 3/1997 | Akashi et al. . |
| 5,817,171 | 10/1998 | Sakurada et al. . |
| 5,866,062 | 2/1999 | Moritz et al. ......................... 264/632 |

FOREIGN PATENT DOCUMENTS

| | | |
|---|---|---|
| 0503816 | 9/1992 | European Pat. Off. . |
| 0747513 | 12/1996 | European Pat. Off. . |
| 3905626 | 8/1989 | Germany . |
| 4192345 | 7/1992 | Japan . |
| 8337490 | 12/1996 | Japan . |
| 9202684 | 8/1997 | Japan . |
| 9726392 | 7/1997 | WIPO . |

OTHER PUBLICATIONS

Nakamura, et al. "Formation Process Of Grown–In Defects In Czochralski Grown Silicon Crystals," *Journal of Crystal Growth*, 180 (1997), pp. 61–72.

Primary Examiner—Felisa Hiteshew
Attorney, Agent, or Firm—Hogan & Hartson LLP

[57] ABSTRACT

A single crystal is grown in accordance with a Czochralski method such that the time for passing through a temperature zone of 1150–1080° C. is 20 minutes or less, or such that the length of a portion of the single crystal corresponding to the temperature zone of 1150–1080° C. in the temperature distribution is 2.0 cm or less. Alternatively, the single crystal is grown such that the time for passing through a temperature zone of 1250–1200° C. is 20 minutes or less, or such that the length of a portion of the single crystal corresponding to the temperature zone of 1250–1200° C. in the temperature distribution is 2.0 cm or less. This method decreases both the density and size of so-called grown-in defects such as FPD (100 defects/cm$^2$ or less), LSTD, and COP (10 defects/cm$^2$ or less) to thereby enable efficient production of a single crystal having an excellent good chip yield (80% or greater) in terms of oxide dielectric breakdown voltage characteristics.

7 Claims, 5 Drawing Sheets

METHOD FOR PRODUCING A SILICON SINGLE CRYSTAL HAVING FEW CRYSTAL DEFECTS, AND A SILICON SINGLE CRYSTAL AND SILICON WAFERS PRODUCED BY THE METHOD

This is a division of application Ser. No. 09/173,931 filed Oct. 16, 1998 now U.S. Pat. No. 6,027,562, which application is hereby incorporated by reference in its entirety.

BACKGROUND OF THE INVENTION

1. Field of the Invention

The present invention relates to a method for producing a silicon single crystal in which the silicon single crystal is pulled in accordance with the Czochralski method (hereinafter referred to as the CZ method), and which can reduce the density and size of crystal defects, called grown-in defects, generated in the crystal in the course of the pulling operation, thereby enabling production of a silicon single crystal having an excellent oxide dielectric breakdown voltage characteristics. The present invention also relates to a silicon single crystal and silicon wafers produced by the method.

2. Description of the Related Art

In order to cope with an increase in the degree of fineness and the degree of integration of semiconductor circuits, quality requirements are recently becoming severer on silicon single crystals which are used as a base material. Particularly, there has been required a reduction in density and size of grown-in defects such as flow pattern defects (FPD), laser scattering tomography defects (LSTD), and crystal originated particles (COP). In order to meet such a requirement, various measures have been employed.

For example, in order to decrease the above-described defects, there may be used a technique disclosed in Japanese Patent Application Laid-Open (kokai) No. 8-337490, in which the time for passing through a temperature zone of 1150–1080° C. during pulling of a single crystal is increased. This technique was developed as a result of investigations and studies regarding the relationship between the thermal history of a silicon single crystal during the growth thereof and introduced crystal defects. For example, when the time for passing through the 1150–1080° C. temperature zone was made equal to or greater than 60 minutes, the FPD density decreased from 1000 defects/cm$^2$ to 400 defects/cm$^2$. The good chip yield in terms of oxide-film dielectric breakdown strength—which can be used as a parameter for evaluating device characteristics—increased from a level below 50% to a level greater than 80%.

Meanwhile, recent studies have revealed that although the density of defects is decreased as the time for passing through the 1150–1080° C. temperature zone is increased, the size of the defects increases. That is, changing the length of the time for passing through the temperature zone causes only a change in the ratio between the density and size of crystal defects but does not cause a change in the total volume of the crystal defects.

The oxide dielectric breakdown voltage characteristics—which can be used as a parameter for evaluating device characteristics—has a strong correlation with the density of crystal defects, and a better oxide dielectric breakdown voltage characteristics is obtained when the defects are relatively large in size and low in density. Therefore, in order to improve the oxide dielectric breakdown voltage characteristics, there has been employed a measure in which the density of defects is decreased at the sacrifice of an increase in the size of the defects.

However, it recently has been reported that defects having a larger size, called COP (Crystal Originated Particles), cause adverse effects on semiconductor devices. Therefore, there has arisen a requirement for concurrently achieving reduction of the density of defects or improvement of the dielectric breakdown strength, and reduction of the size of the defects.

SUMMARY OF THE INVENTION

In view of the foregoing, an object of the invention is to establish a method of producing a single crystal, which can decrease both the density and size of so-called grown-in defects such as FPD, LSTD, and COP, to thereby enable efficient production of a single crystal having an excellent oxide dielectric breakdown voltage characteristics.

In order to achieve the above-described object, the present invention provides a method for producing a silicon single crystal in accordance with the CZ method, wherein the single crystal is grown such that the time for passing through a temperature zone of 1150–1080° C. is 20 minutes or less.

The inventors of the present invention found that if a single crystal being grown is rapidly cooled such that the time for passing through the 1150–1080° C. temperature zone is 20 minutes or less, there is a region where the FPD density starts to decrease due to the shortened passing time. When the time for passing through the temperature zone is decreased, the FPD density and the defect size both decrease, resulting in an increase in the good chip yield in terms of oxide dielectric breakdown voltage characteristics—which can be used as a parameter for evaluating device characteristics. Thus, it becomes possible to stably produce a silicon single crystal by the CZ method and the wafer, which crystal has an extremely low defect density over the entire cross section of the crystal, while maintaining high productivity.

The present invention also provides a method for producing a silicon single crystal in accordance with a CZ method, wherein the single crystal is grown such that the length of a portion of the single crystal corresponding to a temperature zone of 1150–1080° C. in the temperature distribution is 2.0 cm or less.

The inventors of the present invention found that if the length of the portion of the single crystal corresponding to a temperature zone of 1150–1080° C. in the temperature distribution becomes 2.0 cm or less, the time for passing through the 1150–1080° C. temperature zone is shortened even when the single crystal is grown at an ordinary pulling speed, whereby there is a region in which the FPD density starts to decrease. When the length of the portion of the single crystal corresponding to the temperature zone is decreased in order to shorten the time required for passing through the temperature zone, the FPD density and the defect size both decrease, resulting in an increase in the good chip yield in terms of oxide dielectric breakdown voltage characteristics. Thus, it becomes possible to stably produce a silicon single crystal and the wafer, which crystal has an extremely low defect density over the entire cross section of the crystal, while maintaining high productivity.

In the above-described producing methods of the present invention, the single crystal is preferably grown such that the above-described temperature zone is rapidly cooled, and the time for passing through a temperature zone of 1250–1200° C. is 20 minutes or less, or such that the length of a portion of the single crystal corresponding to the temperature zone of 1250–1200° C. in the temperature distribution is 2.0 cm or less.

That is, in the preferred producing method, the producing method by the CZ method in which a single crystal is grown such that the time for passing through the temperature zone of 1150–1080° C. is 20 minutes or less, or such that the length of a portion of the single crystal corresponding to the temperature zone of 1150–1080° C. in the temperature distribution is 2.0 cm or less, is combined with the producing method by the CZ method in which the single crystal is grown such that the time for passing through the temperature zone of 1250–1200° C. is 20 minutes or less, or such that the length of a portion of the single crystal corresponding to the temperature zone of 1250–1200° C. in the temperature distribution is 2.0 cm or less.

When a single crystal being grown is cooled rapidly such that the time for passing through the temperature zone of 1250–1200° C. is 20 minutes or less, or such that the length of a portion of the single crystal corresponding to the temperature zone of 1250–1200° C. in the temperature distribution is 2.0 cm or less, formation of crystal defect nuclei is prevented so that the FPD density decreases. Also, it was confirmed that when the time for passing through the temperature zone is shortened or when the length of the portion of the single crystal corresponding to the temperature zone is shortened, not only the number of crystal defects such as FPD but also the size of such defects decrease, resulting in an increase in the good chip yield in terms of oxide dielectric breakdown voltage characteristics (see Japanese Patent Application Laid-Open (kokai) No. 9-202684).

Therefore, when the method in which rapid cooling is performed in the temperature zone of 1250–1200° C. is combined with the above-described method in which rapid cooling is performed in the temperature zone of 1150–1080° C., the density and size of defects can be decreased further.

That is, according to this method, both of high and low temperature zones are cooled rapidly, so that the time for passing these temperature zones becomes short enough to prevent coagulation and growth of crystal defects, and formation of crystal defect nuclei themselves can be suppressed. In this manner, the synergetic effect of the two-stage rapid cooling further decreases the density and size of defects such as FPD, so that the good chip yield in terms of oxide dielectric breakdown voltage characteristics can be increased.

The present invention also provides a silicon crystal produced in accordance with one of the producing methods of the present invention.

When the above-described rapid cooling method—which has not conventionally been practiced—is applied to crystal growth, not only the density of crystal defects such as FPD but also the size of such defects decrease, so that there can be obtained a silicon single crystal having an increased good chip yield in terms of oxide dielectric breakdown voltage characteristics of wafers obtained from the crystal.

The present invention further provides a silicon wafer whose FPD density is not greater than 100 defects/cm$^2$, whose good chip yield in terms of oxide dielectric breakdown voltage characteristics is 80% or greater, and whose COP density is not greater than 10 defects/cm$^2$.

In this way, when silicon wafers are sliced from the silicon crystal produced in accordance with one of the producing methods of the present invention and are then mirror-polished, wafers having an extremely low defect density and an excellent characteristic in terms of oxide dielectric breakdown voltage characteristics can be produced at a high yield.

As described above, when a single crystal is produced in accordance with the CZ method, the temperature zone of 1150–1080° C. and/or the temperature zone of 1250–1200° C. are cooled rapidly. Therefore, it is possible to produce high quality wafers in which the density of FPD is not greater than 100 defects/cm$^2$, the density of COP is not greater than 10 defects/cm$^2$, and the size of defects is extremely small, and whose good chip yield in terms of oxide dielectric breakdown voltage characteristics is 80% or greater. In addition, since the operation of pulling a single crystal can be performed while a high pulling speed is maintained, high quality crystals can be produced with high productivity.

DESCRIPTION OF THE INVENTION AND THE PREFERRED EMBODIMENTS

Figure 1:
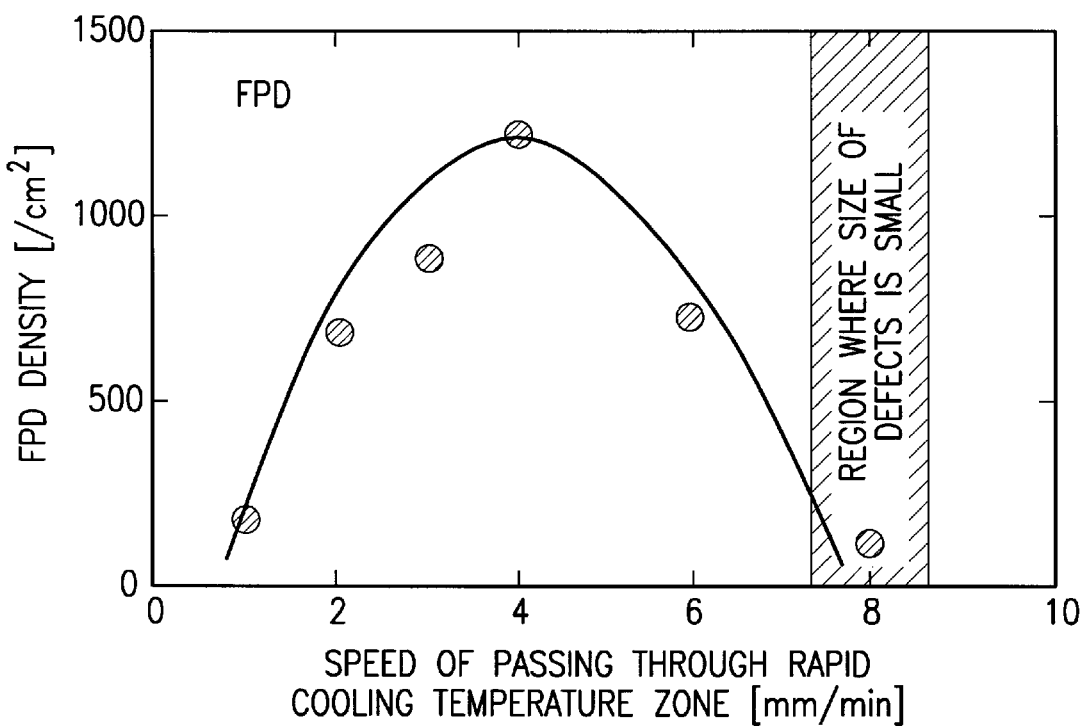
FIG. 1 is a graph showing the relationship between the speed of passing through a crystal rapid-cooling temperature zone and the density of FPD defects of resultant wafers.

The present invention will now be described in detail, but the present invention is not limited thereto.

The inventors of the present invention found that in order to decrease both the density and size of various defects generated in a single crystal being pulled, it is effective to shorten the time for passing through a specific temperature zone or to shorten the length of a portion of the crystal corresponding to the specific temperature zone, i.e., to cause the crystal to have a thermal history such that the specific temperature zone is cooled rapidly. Based on this finding and through detailed investigations on various operating conditions, the present invention was completed.

First, terms appearing herein will be described.

1) FPD (Flow Pattern Defect) denotes flow patterns which, together with pits, are generated in the surface of a wafer which is sliced from a grown silicon single-crystal ingot and which is treated by the steps of: removing a damaged layer from the surface portion of the wafer through etching with a mixed solution of hydrofluoric acid and nitric acid; and etching the wafer surface with a mixed solution of $K_2Cr_2O_7$, hydrofluoric acid, and water (Secco etching). As FPD density in the wafer surface portion becomes higher, failure rate with regard to dielectric breakdown strength of oxide film increase (Japanese Patent Laid-Open (kokai) No. 4-192345).

2) LSTD (Laser Scattering Tomography Defect) denotes a defect existing in a wafer, and the scattering light due to the defect can be detected in the following manner. In that, a wafer is sliced from a grown silicon single-crystal ingot, and is then treated by the steps of: removing a damaged layer from the surface portion of the wafer through etching with a mixed solution of hydrofluoric acid and nitric acid; and cleaving the wafer. When infrared light is introduced into the wafer through the cleavage plane, and light exiting from the wafer surface is detected, a scattering light due to the defects existing in a wafer can be detected. A scattering defect detected in this observation has already been reported at a meeting of an academic society or the like and is considered to be an oxide precipitate (J.J.A.P. vol. 32, p.3679, 1993). According to recent research, LSTD is reported to be an octahedral void.

3) COP (Crystal Originated Particle) denotes a defect which deteriorates the dielectric breakdown strength of oxide film at a central portion of a wafer and which is revealed as FPD in the case of treatment through Secco etching, but is revealed as COP in the case of cleaning in SC-1 (cleaning by using mixed aqueous solution of ammonia, hydrogen peroxide, example of ratio is $NH_4OH:H_2O_2:H_2O=1:1:10$) which serves as a selective etchant. The pit has a diameter not greater than 1 $\mu$m and is examined by a light scattering method.

Since the density of defects such as FPD, LSTD, and COP has a correlation with the failure rate in terms of oxide dielectric breakdown voltage characteristics, these kinds of defects are all considered factors that degrade the oxide dielectric breakdown voltage characteristics. Accordingly, the FPD, LSTD, and COP must be reduced in order to improve the oxide dielectric breakdown voltage characteristics of a silicon single crystal produced in accordance with the CZ method.

The inventors of the present invention first conducted studies in order to reduce the size of defects. As a result, the inventors judged that coagulation of defects certainly occurs in the temperature zone of 1150–1080° C., and therefore if no time is given to defects to coagulate, the size of the defects can be reduced; and that such agglomeration of defects can be prevented through shortening the time for passing through the temperature zone of 1150–1080° C.—which time has conventionally been set to 60 minutes or longer for gradual cooling. However, it is apparent that the mere change of the passing time causes an increase in the density of crystal defects and a degradation in the oxide dielectric breakdown voltage characteristics.

In view of the foregoing, the inventors of the present invention established a hypothesis. The present inventors considered that when FPD, LSTD, and COP are detected, atomic level point defects are not observed but a group of defects having a relatively large size is detected. That is, there conceivably exists a lower limit for detection of FPD, LSTD, and COP. Therefore, if the speed of cooling a single crystal is made faster than that in the conventional method to thereby decrease the size of defects to a certain level or smaller, the size of FPD, LSTD, COP, etc. becomes very small, so that the detected density decreases and the oxide dielectric breakdown voltage characteristics can be improved.

Figure 2:
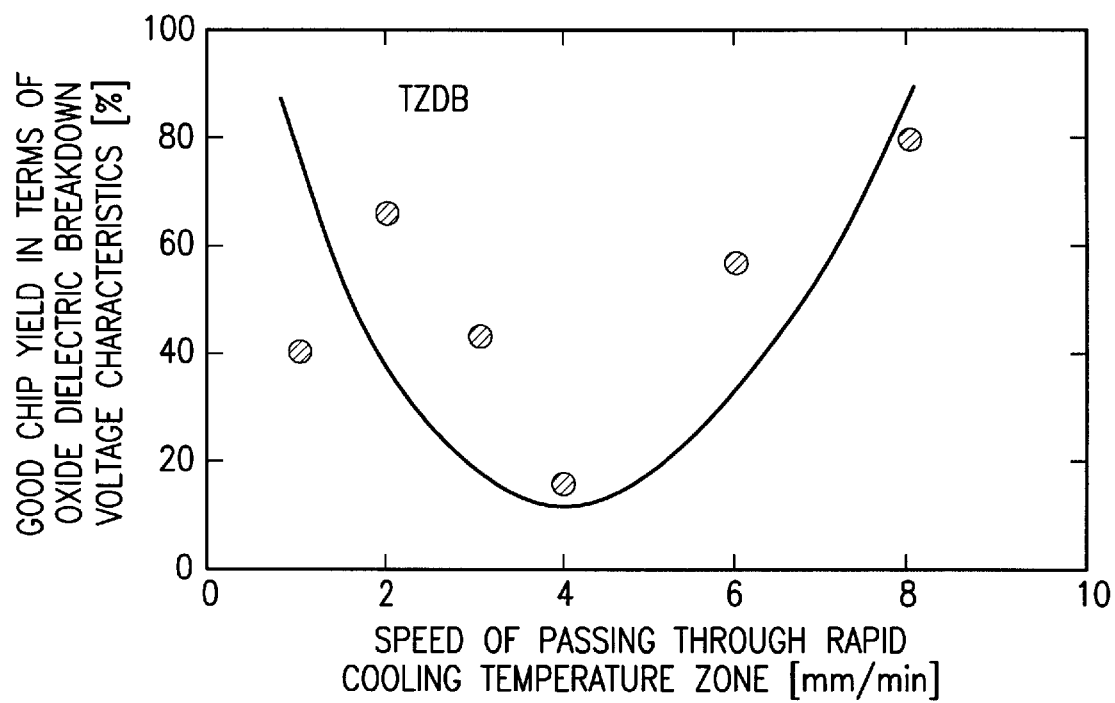
FIG. 2 is a graph showing the relationship between the speed of passing through a crystal rapid-cooling temperature zone and the good chip yield of resultant wafers in terms of C-mode oxide dielectric breakdown voltage characteristics.

In order to confirm the above-described hypothesis, the inventors of the present invention performed the following experiment and investigated the relationship between the time for passing through a temperature zone of 1150–1080° C. and the density of defects, as well as the relationship between the time for passing through the temperature zone of 1150–1080° C. and the oxide dielectric breakdown voltage characteristics in various cooling methods including a rapid cooling method that has not conventionally been employed. That is, a silicon single crystal was separated from silicon melt in the course of growth thereof, and pulled upward such that the crystal passed through the temperature zone of 1150–1080° C. at a certain passing speed. A plurality of silicon single crystals were grown in the above-described manner while the passing speed was changed in order to change the speed of cooling the silicon single crystal. FIGS. 1 and 2 show the results of this experiment.

The temperature distribution within a crystal growing apparatus used in the experiment was measured in advance, and it was confirmed that the temperature zone of 1150–1080° C. had a length of approximately 8 cm.

FIG. 1 shows the relationship between the speed at which a crystal passes through the temperature zone of 1150–1080° C. and the density of FPD. When the passing speed is not greater than 4 mm/min, i.e., when the time for passing through the temperature zone of 1150–1080° C. exceeds 20 minutes (the left half of FIG. 1), the FPD density increases with increasing the passing speed. By contrast, when the time for passing through the temperature zone of 1150–1080° C. is not greater than 20 minutes (the right half of FIG. 1), the FPD density decreases with increasing passing speed. Through the investigation and experiment performed in this time, it was found that in the hatched region the size of FPD is small and the density of FPD is low.

This phenomenon conceivably occurs because the size of defects becomes very small due to extremely rapid cooling, so that the number of defects having sizes below the detection lower limit increases.

FIG. 2 shows the relationship between the speed of passing through rapid cooling temperature zone of a crystal and the good chip yield ratio in terms of the oxide dielectric breakdown voltage characteristics. When the passing speed is decreased or increased from 4 mm/min, the good chip yield increases drastically. This graph indicates that the oxide dielectric breakdown voltage characteristics can be improved through increase of the speed of cooling such that each portion of the crystal passes through the temperature zone of 1150–1080° C. within 20 minutes.

Further, the present inventors found that, when the speed at which each portion of a silicon single crystal passes through the temperature zone of 1150–1080° C. is increased to 8 mm/minute or greater, i.e., when the time for passing through the temperature zone of 1150–1080° C. is shortened to 10 minutes or less, the size of defects generated in the silicon single crystal is further reduced, so that there can be obtained a silicon single crystal having an excellent oxide dielectric breakdown voltage characteristics and a low defect crystal in which the FPD density is not greater than 100 defects/$cm^2$ and the good chip yield in terms of oxide dielectric breakdown voltage characteristics is 90% or more.

However, there exist cases where a single crystal cannot be grown at a speed equal to or greater than 4 mm/minute or 8 mm/min. In such cases, the inside structure of a furnace of a crystal growing apparatus may be adjusted such that the length of a portion corresponding to the temperature zone of 1150–1080° C. is made 2.0 cm or less. If the length of the portion of the single crystal corresponding to the temperature zone of 1150–1080° C. is made 2.0 cm or less, the time for passing through the 1150–1080° C. temperature zone can be shortened to 20 minutes or less, even when the single crystal is grown at an ordinary pulling speed. Thus, the density and size of crystal defects can be decreased to a desired level.

The inventors of the present invention had previously investigated another relationship between the thermal history of a crystal a nd crystal defects generated therein, which are described in Japanese Patent Application No. 8-26021 (Japanese Patent Application Laid-Open (kokai) No. 9-202684). From the investigation, the inventors had found that the time for passing through a temperature zone of 1250–1200° C. affects formation of crystal defect nuclei, and thus confirmed that in the temperature zone of 1250–1200° C. formation of crystal defect nuclei can be suppressed when the time for passing through this temperature zone is shortened to not greater than 20 minutes.

Therefore, when the method in which the rapid cooling is performed in the temperature zone of 1150–1080° C. is combined with the method in which the rapid cooling is performed in the temperature zone of 1250–1200° C., the formation of crystal defect nuclei is suppressed effectively, so that the density and size of defects can be decreased further.

However, there exist cases where the time for passing through a temperature zone of 1250–1200° C. cannot be shortened to not greater than 20 minutes through a mere increase in the crystal growth rate. In such cases, the length of a portion corresponding to the temperature zone of 1250–1200° C. is made 2.0 cm or less. If the length of the portion of the single crystal corresponding to the temperature zone of 1250–1200° C. is made 2.0 cm or less, the time for passing through the 1250–1200° C. temperature zone can be shortened to 20 minutes or less, even when the single crystal is grown at an ordinary pulling speed. Thus, formation of crystal defect nuclei is suppressed, and the density and size of crystal defects can be decreased to a desired level.

Figure 3:
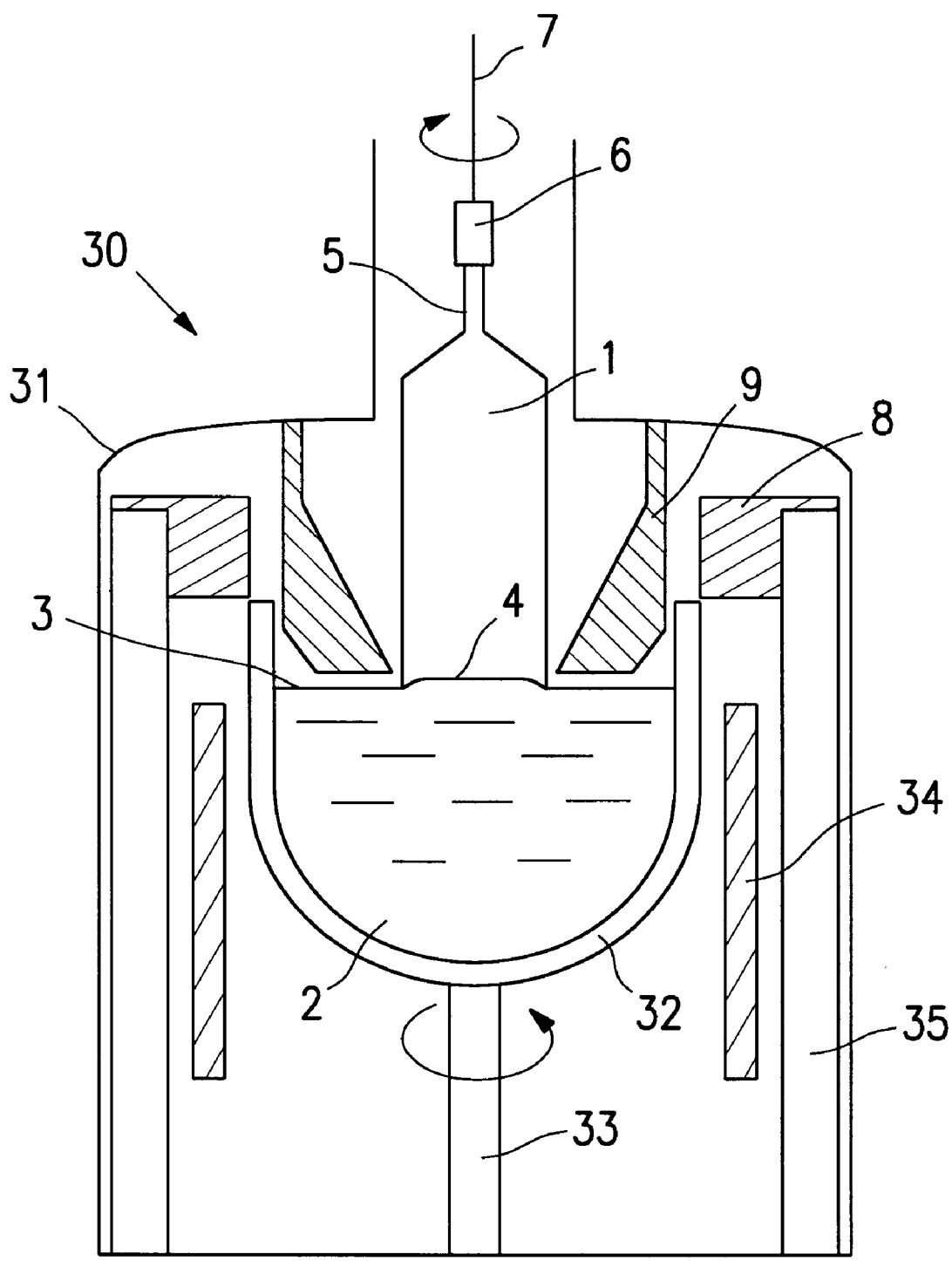
FIG. 3 is a schematic view showing the structure of a rapid-cooling type silicon single crystal pulling apparatus used in the present invention.

Embodiments of the present invention will now be described in detail with reference to the drawings. FIG. 3 shows a rapid-cooling type crystal pulling apparatus used in the present invention which operates in accordance with the CZ method. As shown in FIG. 3, the crystal pulling apparatus 30 includes a pull chamber 31, a crucible 32 provided within the pull chamber 31, a heater 34 disposed around the crucible 32, a crucible-holding shaft 33 for rotating the crucible 32 and a rotation mechanism (not shown) for rotating the crucible-holding shaft 33, a seed chuck 6 for holding a silicon seed crystal 5, a cable 7 for pulling the seed chuck 6, and a winding mechanism (not shown) for rotating or winding up the cable 7. The crucible 32 includes an inner quartz crucible for containing a silicon melt 2 and an outer graphite crucible located outside the quartz crucible. A heat insulating cylinder 35 is disposed around the heater 34.

In order to establish operating conditions for the producing method of the present invention, an annular solid-liquid interface insulator 9 is arranged around the solid-liquid interface of a single crystal such that the insulator 9 extends from the outer periphery of the solid-liquid interface to the ceiling of the pulling chamber. A gap of a few centimeters is formed between the lower end of the insulator 9 and the surface 3 of the silicon melt 2, thereby heat dissipation can be suppressed around the interface. Further, the wall thickness of the insulator 9 is gradually decreased toward the ceiling so that the gap between the insulator 9 and the single crystal 1 being grown continuously increases toward the ceiling, thereby rapid cooling can be performed. Moreover, an upper insulator 8 is provided above the heater in order to block radiant heat from the heater.

Recently, a so-called MCZ method has often been employed. When the MCZ is employed, an unillustrated magnet is disposed outside the pull chamber 31 in a horizontal direction so as to apply a magnetic field to the silicon melt 2 in a horizontal or vertical direction or in a like direction. Through the application of a magnetic field to the silicon melt 2, convection of the melt 2 is suppressed to thereby stably grow a single crystal.

Next will be described a method for growing a single crystal through use of the crystal pulling apparatus 30 of FIG. 3. First, a high-purity polycrystalline material of silicon is heated to its melting point (approximately 1420° C.) or higher and is thus melted in the crucible 32. Next, the cable 7 is released until a tip end of the seed crystal 5 comes into contact with the surface of the melt 2 at a central portion or is immersed into the melt 2 at a central portion. Subsequently, the crucible-holding shaft 33 is rotated in an appropriate direction. At the same time, the cable 7 is rotated and wound up to thereby pull the seed crystal 5. Thus is started the growth of a single crystal. Then, through adequate regulation of the pull rate and temperature, a substantially cylindrical single-crystal ingot 1 can be obtained.

To achieve the objects of the present invention, the invention employs the following structural features. As shown in FIG. 3, the annular solid-liquid interface insulator 9 is disposed in the pull chamber 31 such that the solid-liquid interface insulator 9 surrounds the single crystal 1 and extends from a point in the vicinity of the surface of the melt to the ceiling of the pulling chamber. In addition, the upper insulator 8 is disposed above the heater 34. Further, when needed, a crystal-cooling device, for example, an unillustrated gas flow guide cylinder, may be provided above the insulator. A cooling gas is blown through the gas flow guide cylinder from above to thereby cool the single crystal 1. The gas flow guide cylinder may include a radiant heat reflector attached to a lower portion of the flow regulation tube.

As mentioned above, an insulator is arranged immediately above the surface of the melt with a predetermined gap formed therebetween, and the insulator has a structure to provide a clearance between a single crystal being grown and the upper portion of the insulator such that the clearance continuously increases upward. This structure yields a heat keeping effect in the vicinity of the crystal growth interface due to the radiant heat. At the upper portion of the insulator, cooling is effected rapidly in a specific temperature zone. In addition, an upper portion of the crystal is shielded from radiant heat from the heater or the like. As a result, the operating conditions for the producing method of the present invention are established in cooperation with control of the pulling speed of the crystal.

In addition to the gas flow guide cylinder, an air-cooled duct, a water-cooled tube, or a like device may be provided as a crystal cooling device, such that the device surrounds a crystal being grown so as to establish a desired temperature gradient in the crystal.

Figure 4:
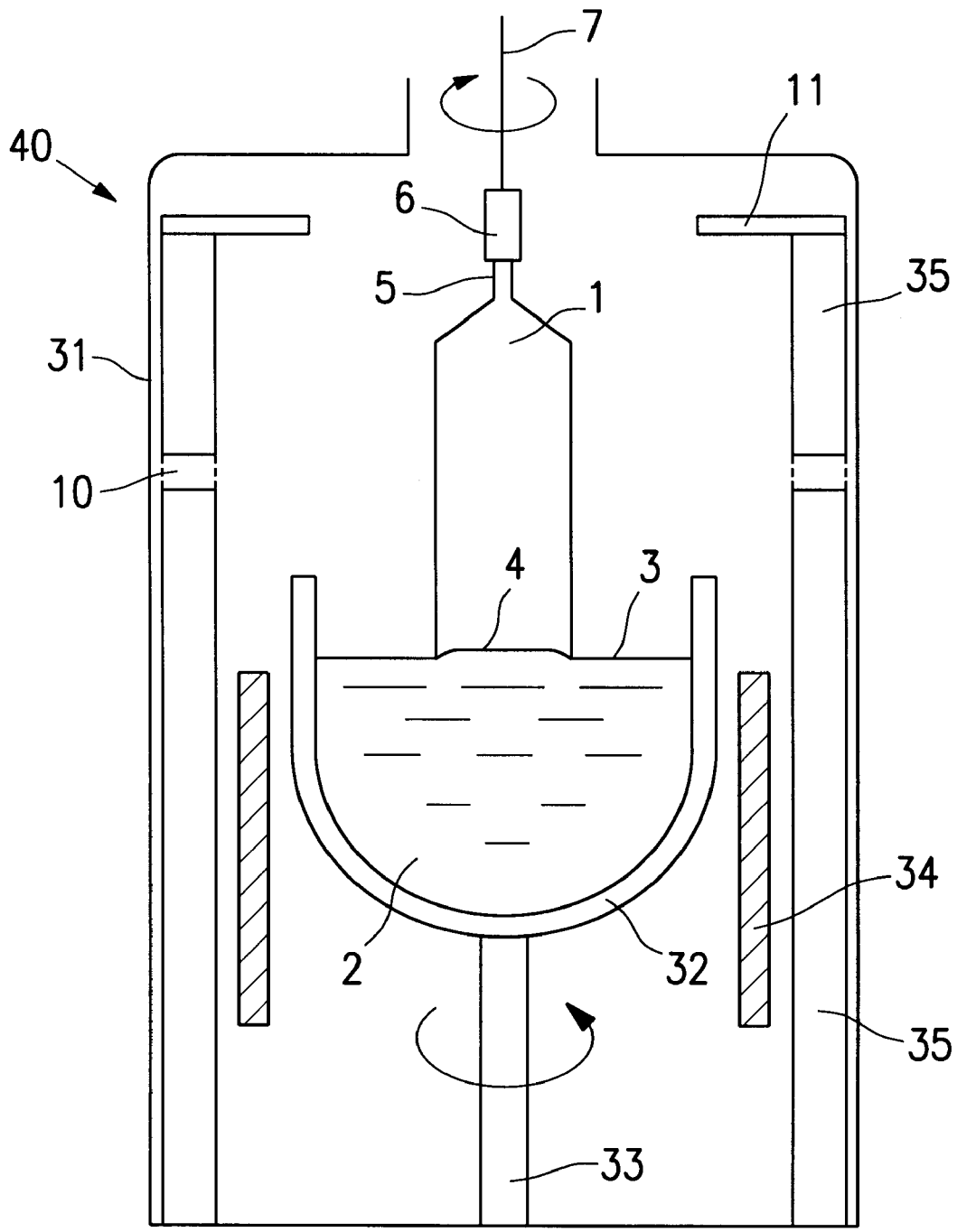
FIG. 4 is a schematic view showing the structure of a conventional gradual-cooling type silicon single crystal pulling apparatus.
Figure 5:
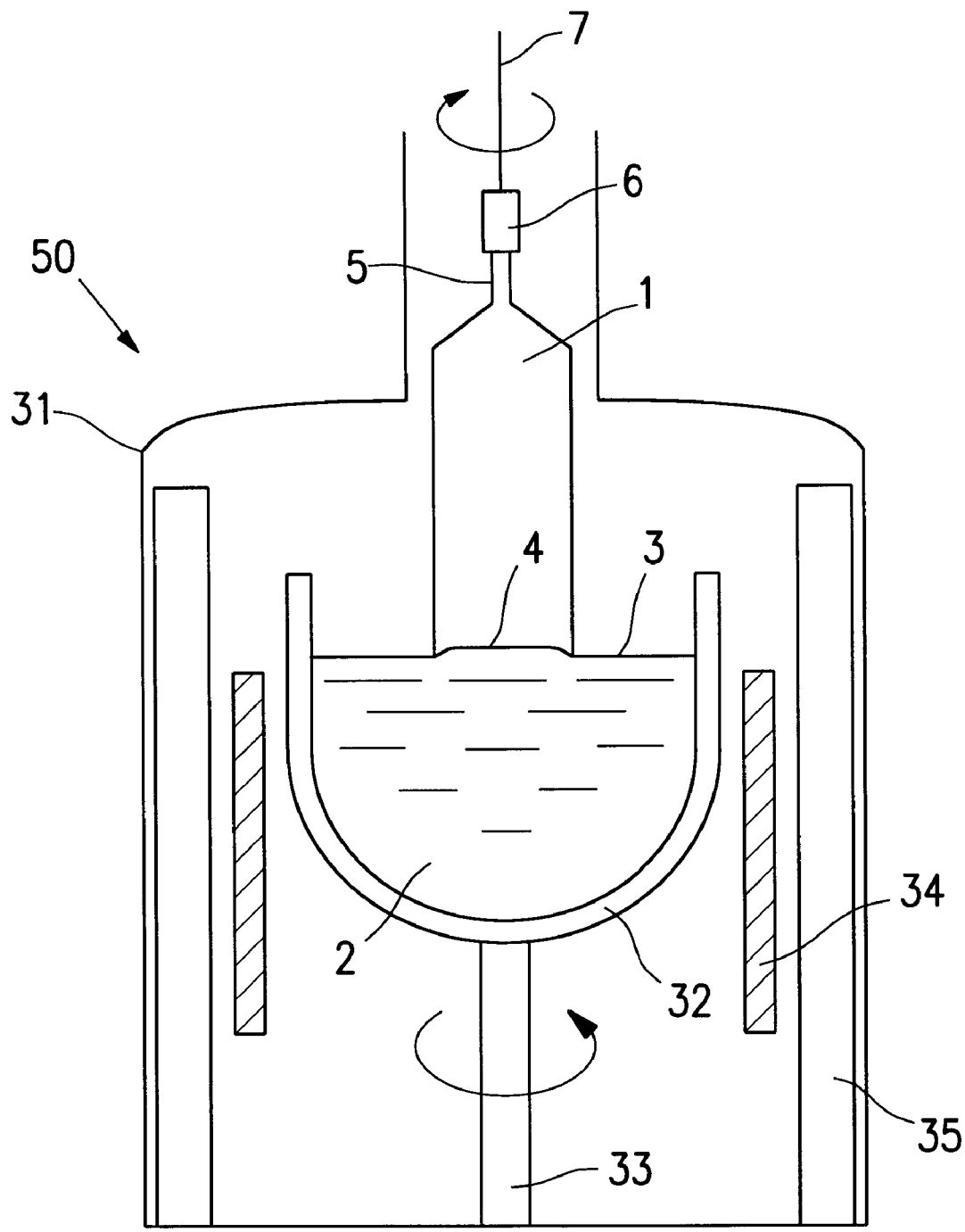
FIG. 5 is a schematic view showing the structure of a conventional silicon single crystal pulling apparatus.

For comparison with the rapid cooling type crystal pulling apparatus used in the present invention, a conventional gradual-cooling type silicon single crystal pulling apparatus is shown in FIG. 4, and a conventional silicon single crystal pulling apparatus is shown in FIG. 5. Their basic structures are the same as that of the rapid cooling type crystal pulling apparatus used in the present invention (see FIG. 3). However, the apparatus shown in FIGS. 4 and 5 differ from the apparatus used in the present invention in terms of the presence/absence of the solid-liquid interface insulator and the upper insulator above the heater, and the position of the insulator.

EXAMPLES

The present invention will next be described by way of examples, which should not be construed as limiting the invention.

Example 1

A silicon single crystal was pulled through use of the crystal producing apparatus 30 shown in FIG. 3, whose furnace has a structure adapted to rapid cooling. Forty kg of polycrystalline material of silicon were charged into a quartz crucible having a diameter of 18 inches. A single crystal ingot having a diameter of 6 inches and orientation <100> was pulled in accordance with the CZ method.

The pulling of the single crystal ingot was performed under preset growth conditions such that the time for passing through the 1150–1080° C. temperature zone was 12 minutes, the length of the 1150–1080° C. temperature zone was 2.0 cm, and the speed of passing through the 1150–1080° C. temperature zone (crystal pulling speed) was 1.67 mm/min.

Wafers were sliced from the thus-obtained single crystal ingot. The wafers w ere mirror-polished, yielding single-crystal mirror wafers of silicon. The thus-obtained mirror wafers were measured in order to determine the grown-in defects and the oxide dielectric breakdown voltage characteristics (C-mode). Table 1 shows the values of thus determined FPD, COP, and TZDB (Time Zero Dielectric Breakdown) [good chip yield in terms of oxide dielectric breakdown voltage characteristics].

The oxide dielectric breakdown voltage characteristics (C-mode) was measured under the conditions such that the thickness of oxide film was 25 nm, measurement electrodes were phosphorous-doped polysilicon, the area of the electrodes was 8 $mm^2$, and current employed for judgment was 1 $mA/cm^2$, and a chip that did not cause dielectric breakdown in an electric field of 8 MV/cm or below was judged to be good.

Example 2

A single crystal ingot was pulled under the same conditions and through use of the same apparatus as that used in Example 1, except that the pulling conditions were set such that the time for passing through the 1250–1200° C. temperature zone was 12 minutes, the length of the 1250–1200° C. temperature zone was 2.0 cm, and the speed of passing through the 1250–1200° C. temperature zone (crystal pulling speed) was 1.67 mm/min. The resultant values of thus obtained silicon wafer's FPD, COP, and TZDB are also shown in Table 1.

Comparative Example 1

A single crystal ingot was pulled at a pulling speed of 1.1 mm/min through use of the crystal pulling apparatus 40 shown in FIG. 4, whose furnace has a structure adapted to gradual cooling in the temperature zone of 1150–1080° C. Subsequently, mirror-polished wafers were produced from the thus-grown ingot and were measured in the same manner as in Example 1. The results of the measurement are also shown in Table 1.

The crystal pulling apparatus 40 shown in FIG. 4 has basically the same structure as that of the crystal pulling apparatus 30 used in Examples 1 and 2. However, in order to effect gradual cooling in the temperature zone of 1150–1080° C., a heat insulating cylinder 35 surrounding a heater 34 is extended upward, and a carbon ring 11 is placed thereon in order to prevent radiation of radiant heat from the crystal surface, thereby decreasing the cooling speed. Further, a part of the heat insulating cylinder 35 surrounding the heater 34 is cut away in order to provide a split portion 10 to thereby divide the heat insulating cylinder 35 into upper and lower portions. Thus, the high temperature zone between the melting point and 1200° C. is cooled rapidly. The furnace having the above-described structure decreases the time for passing through the high temperature zone and increases the time for passing through the temperature zone of 1150–1080° C. in comparison with the conventional rapid cooling method in Comparative Example 2.

Comparative Example 2

A single crystal ingot was pulled at a pulling speed of 1.25 mm/min through use of the crystal pulling apparatus 50 shown in FIG. 5, whose furnace has a conventional structure. Another pulling conditions were not set. In this case, no cooling device was disposed in the pulling apparatus. Subsequently, mirror-polished wafers were produced from the thus-grown ingot and were measured in the same manner as in Example 1. The results of the measurement are also shown in Table 1.

TABLE 1

| | | Items | | |
|---|---|---|---|---|
| Ex. No. | Type of pulling apparatus | FPD (defects/$cm^2$) | TZDB (%) | COP (0.16 μm) (defects/$cm^2$) |
| Example 1 | 1150–1080° C. Rapid cooling type | about 200 | about 90 | about 10 |
| Example 2 | 1250–1200° C. Rapid cooling type | about 3 | about 93 | about 8 |
| Comparative Example 1 | 1150–1080° C. Gradual cooling type | about 400 | about 80 | about 100 |
| Comparative Example 2 | Conventional cooling type | about 1000 | about 50 | about 10 |

The present invention is not limited to the above-described embodiments. The above-described embodiments are mere examples, and those having the substantially same structure as that described in the appended claims and providing the similar action and effects are included in the scope of the present invention.

What is claimed is:

1. A silicon single crystal produced by a method in accordance with a Czochralski method, wherein the single crystal is grown such that the time for passing through a temperature zone of 1150–1080° C. is 20 minutes or less.

2. The silicon single crystal of claim 1, wherein the single crystal is grown such that the time for passing through a temperature zone of 1250–1200° C. is 20 minutes or less.

3. The silicon single crystal of claim 1, wherein the single crystal is grown in such that the length of a portion of the single crystal corresponding to a temperature zone of 1250–1200° C. in the temperature distribution is 2.0 cm or less.

4. A silicon single crystal produced by a method in accordance with a Czochralski method, wherein the single crystal is grown such that the length of a portion of the single crystal corresponding to a temperature zone of 1150–1080° C. in the temperature distribution is 2.0 cm or less.

5. The silicon single crystal of claim 4, wherein the single crystal is grown such that the time for passing through a temperature zone of 1250–1200° C. is 20 minutes or less.

6. The silicon single crystal of claim 4, wherein the single crystal is grown in such that the length of a portion of the single crystal corresponding to a temperature zone of 1250–1200° C. in the temperature distribution is 2.0 cm or less.

7. A silicon wafer whose FPD density is not greater than 100 defects/$cm^2$, whose good chip yield in terms of oxide dielectric breakdown voltage characteristics is 80% or greater, and whose COP density is not greater than 10 defects/$cm^2$.

* * * * *